(12) United States Patent
Evans

(10) Patent No.: US 6,911,674 B2
(45) Date of Patent: Jun. 28, 2005

(54) FEEDBACK AND COUPLING STRUCTURES AND METHODS

(75) Inventor: Allan Keneth Evans, Oxford (GB)

(73) Assignee: ZEOLUX Corporation, Sammamish, WA (US)

( * ) Notice: Subject to any disclaimer, the term of this patent is extended or adjusted under 35 U.S.C. 154(b) by 0 days.

(21) Appl. No.: 10/414,567

(22) Filed: Apr. 16, 2003

(65) Prior Publication Data

US 2004/0206965 A1 Oct. 21, 2004

(51) Int. Cl.[7] .............................................. H01L 29/16
(52) U.S. Cl. .......................... 257/83; 257/79; 257/80; 257/88; 257/431; 257/432; 257/918
(58) Field of Search ........................ 257/79–80, 83, 257/88, 431–432, 918

(56) References Cited

U.S. PATENT DOCUMENTS

| | | | | |
|---|---|---|---|---|
| 3,748,480 A | * | 7/1973 | Coleman | 257/51 |
| 4,602,847 A | * | 7/1986 | Born et al. | 427/255.7 |
| 4,730,327 A | * | 3/1988 | Gordon | 372/45 |
| 4,805,183 A | * | 2/1989 | Kudo et al. | 372/96 |
| 4,919,507 A | * | 4/1990 | Evans et al. | 385/37 |
| 5,043,991 A | * | 8/1991 | Bradley | 372/32 |
| 5,193,130 A | * | 3/1993 | Nishiwaki et al. | 385/14 |
| 5,220,573 A | * | 6/1993 | Sakata et al. | 372/50 |
| 5,226,053 A | * | 7/1993 | Cho et al. | 372/45 |
| 5,265,111 A | * | 11/1993 | Chesnoy et al. | 372/32 |
| 5,703,899 A | * | 12/1997 | Mizutani | 372/96 |
| 5,838,854 A | * | 11/1998 | Taneya et al. | 385/50 |
| 6,018,421 A | * | 1/2000 | Cushing | 359/589 |
| 6,307,827 B1 | * | 10/2001 | Nishiwaki | 369/112.07 |
| 6,363,093 B1 | * | 3/2002 | Glance | 372/50 |
| 6,411,640 B1 | * | 6/2002 | Nakanishi | 372/96 |
| 6,507,595 B1 | * | 1/2003 | Kapon et al. | 372/45 |
| 6,661,034 B2 | * | 12/2003 | Kawase | 257/103 |
| 6,720,585 B1 | * | 4/2004 | Wasserbauer et al. | 257/98 |
| 6,850,366 B2 | * | 2/2005 | Hendrix et al. | 359/589 |
| 2002/0057872 A1 | * | 5/2002 | Nishikawa | 385/32 |
| 2002/0172247 A1 | * | 11/2002 | Sopra et al. | 372/46 |
| 2003/0103543 A1 | * | 6/2003 | Moser et al. | 372/96 |

OTHER PUBLICATIONS

John M. Lupton et al., Bragg Scattering from Periodically Microstructured Light Emitting Diodes, Applied Physics Letters, Nov. 20, 2000, vol. 77, No. 21, pp. 3340–3343.

* cited by examiner

*Primary Examiner*—Amir Zarabian
*Assistant Examiner*—Ida M. Soward
(74) *Attorney, Agent, or Firm*—Ronald D. Trice

(57) ABSTRACT

A light emitting device may include a light emitting layer such as an organic semiconductor material, one or more feedback structures, and a coupling structure. The one or more feedback structures may cause light emitted by the light emitting layer to be fed back through it along an axis in the plane of the device, thereby promoting the stimulated emission of light in the light emitting layer. The coupling structure couples some fraction of the feedback light out of the device. The coupled light may be emitted along an axis substantially normal to the plane of the device or at predetermined angles. The coupling and feedback structures may have a corrugated structure, a continuous variation of refractive index along an axis in the device plane, a period refractive index, or any combination thereof. The coupling and feedback structures may be separate, share common portion or combined together.

55 Claims, 7 Drawing Sheets

FEEDBACK AND COUPLING STRUCTURES AND METHODS

FIELD OF THE INVENTION

The present invention relates generally to a light emitting device including a feedback structure and a coupling structure, and more particularly, an organic light emitting diode (OLED) device including a feedback structure and a coupling structure having a corrugated or periodic structure.

BACKGROUND

The emitter layers of feedback enhanced organic light emitting diode (FE-OLED) devices that produce light are very thin (e.g., tens of nanometers). Because the emitter layer is so thin, if the device is used in a vertically emitting mode, producing a sufficient rate of stimulated emission requires a very high density of excitons and/or a very high photon flux for feedback photons in the emitter layer. A very high exciton density may be achieved by the application of a very high current density through the FE-OLED device. Unfortunately, very high current densities complicate the design, reduce the efficiency, increase the cost, and limit the utility and number of applications of FE-OLED devices. Similarly, producing very high photon fluxes for the feedback photons within the emitter layer requires a larger percentage of light be fed back into the emitter layer. This feedback is achieved by increasing the reflectivity of the feedback elements and results in light traveling back and forth in FE-OLED devices for longer periods of time. This in turn leads to higher light loses in the device and consequently reduced device efficiency because light is lost on every pass through the device. This limits the utility and number of applications of FE-OLED devices. Accordingly, there is a strong need in the art for a way to overcome the foregoing problems associated with thin emissive layers in FE-OLED devices.

SUMMARY OF THE INVENTION

An aspect of the present invention is to provide a light emitting diode device including a light emitting diode and a vertical coupling structure. The vertical coupling structure changes a propagation direction of a portion of a substantially horizontal stimulated light emission within the light emitting diode such that the portion of the substantially horizontal stimulated light emission exits the light emitting diode as output light.

Another aspect of the invention is to provide a method of generating light including energizing a light emitting material such the light emitting material emits light, reflecting at least a portion of the light emitted by the light emitting material back through the light emitting material to stimulate the emission of stimulated light, and altering a direction of a portion of the stimulated light such that the portion of the stimulated light is coupled away from the light emitting material.

Another aspect of the invention is to provide an emissive device including a grating, an anode adjacent the grating, a hole injection layer adjacent the anode, a hole transport layer adjacent the hole injection layer, an emissive layer adjacent the hole injection layer, an electron transport layer adjacent emissive layer, an electron injection layer adjacent the electron transport layer, a cathode adjacent the electron injection layer, and a planarizing layer adjacent the cathode. The hole transport layer and the anode have an index of refraction higher than the electron transport layer such that the hole transport layer, the anode and the electron transport layer form a waveguide. The grating couples back a portion of a light incident thereon toward the anode and couples another portion of the light incident thereon away from anode.

Another aspect of the invention is to provide a feedback enhanced emitter including a light emitter, a feedback structure and a coupling structure. The feedback structure reflects light generated by the light emitter back into the light emitter. The coupling structure changes the propagation direction of a portion of a stimulated light emission within the light emitter such that the portion of the stimulated light emission exits the light emitter as output light.

Another aspect of the invention is to provide a method of generating light including energizing a light emitting material to generate a first light, reflecting at least a portion of the first light back to the light emitting material to stimulate an emission of a second light along a first axis, and altering a propagation direction at least a portion of the second light to at least a second axis. The first axis and the at least a second axis are not substantially parallel.

BRIEF DESCRIPTION OF THE DRAWINGS

The invention will be described in detail with reference to the following drawings in which like reference numerals refer to like elements wherein.

DETAILED DESCRIPTION

Figure 1:
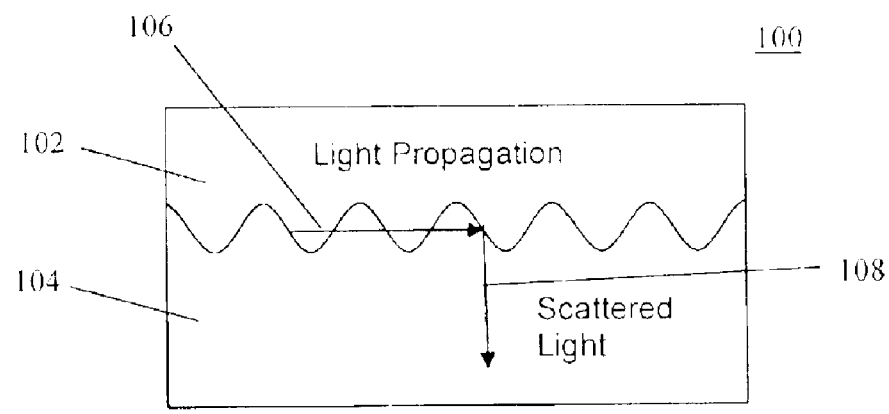
FIG. 1 illustrates an exemplary corrugated structure.

Exemplary embodiments of the present invention may include a light emitting layer, one or more feedback structures, and one or more coupling structures. The light emitting layer may include an organic semiconductor material or another suitable material that emits light. The one or more feedback structures may cause light emitted by the light emitting layer to be fed back through it along an axis in the plane of the device. The feedback of light thereby promotes the stimulated emission of light in the light emitting layer. The coupling structure couples some fraction of the feedback light out of the device. The coupled light may be emitted along an axis substantially normal to the plane of the device or at predetermined angles.

For example, the light emitting layer may include a semiconductor such as the organic semiconductor, aluminum triquinoline complex (Alq$_3$). The Alq$_3$ may have an electron band structure leading to emission of light at a desired wavelength or wavelengths. The organic semiconductor may include molecules of relatively low molecular weight up through high molecular weight polymers. Alternatively, the semiconductor may be fabricated from wholly organic material, wholly inorganic material, organometallic material, composite emitter materials or any other suitable materials. The light emitting layer may be interposed between two electrodes. One of the two electrodes is a cathode and the other of the two electrodes is an anode. The cathode may be fabricated from materials that promote the injection of electrons into the organic semiconductor. The anode may be fabricated from transparent conductive materials that promote injection of holes into the organic semiconductor, such as indium-tin oxide. Alternatively, the additional layers may be interposed between the light emitting layer and the electrodes. For example, such additional layers may be fabricated from materials that either facilitate injection of charge carriers into the organic semiconductor or transport charge carriers from the site of injection into the desired emissive area in the organic semiconductor.

The feedback structures may have a periodic oscillation in refractive index along an axis in the plane of the device. The layer of the device containing this index oscillation is at least partially in the path of the light emitted by the emissive layer and traveling in the plane of the device parallel to the axis along which the index oscillation occurs. The scattering angle for light moving through a volume of material having oscillating refractive index in this parallel configuration is given by the Equation 1:

$$\sin \Theta = (\kappa - \nu)/\kappa \qquad \text{(Equation 1)}$$

where:
$\Theta$=the angle between the normal to the plane of the device and the scattering direction,
$\kappa$=the wavenumber of the scattered light, and
$\nu$=the spatial frequency of the refractive index oscillation.
By proper selection of $\kappa$ and $\nu$, the desired scattering of light from the structure will result. For example, by selecting $\nu=2\kappa$, $\Theta$ becomes equal to $-90°$, and light scattered perpendicular to the (100) planes in the one-dimensional lattice results. This results in the desired feedback structure since part of the light interacting with a structure is reflected straight back while the rest continues straight onward. Such a feedback structure may be described as having a refractive index oscillation with spatial period equal to one-half the wavelength of the emitted light.

In the case of a coupling structure, light may be scattered normal to the plane of the device. This may be achieved by selecting $\nu=\kappa$ in which case $\Theta=0°$. This results in a structure with a refractive index oscillation whose spatial period is equal to the wavelength of the scattered light and will scatter light normal to the plane of the device. Various values of $\Theta$ for the coupling layer are possible so long as the angle from the normal is sufficiently low to allow light to escape the light emissive layer and the device. For example, selecting $\nu=3/2\kappa$ and $\Theta=-30°$ results in two beams of light emerging from the device at + and $-30°$. A light directing or filtering element may be placed on the surface of the device to filter or alter the direction light is emitted from the device. For example, a light scattering element may be used to scatter light while a filtering element may be used to transmit light along one direction (e.g., 30°) while filtering light along the other direction (e.g., $-30°$).

The light emitting layer, the one or more feedback structures, and the one or more coupling structures may be combined in a variety of embodiments and additional elements may also be included. These embodiments generally break down into three principal categories 1. embodiments involving corrugations of some kind, 2. embodiments involving layers containing a continuous variation in refractive index, and 3. embodiment not involving corrugations or a continuous variation in refractive index. Several exemplary embodiments are discussed with respect to the figures.

FIG. 1 illustrates an exemplary corrugated structure 100. The corrugated structure 100 includes a first dielectric material 102 and a second dielectric material 104 that form a corrugated interface and have differing indices of refraction. Thus, light 106 traversing the interface experiences a periodically oscillating refractive index and some of that light 106 is scattered to form scatter light 108 that may be vertically emitted from the structure 100.

Figure 2:
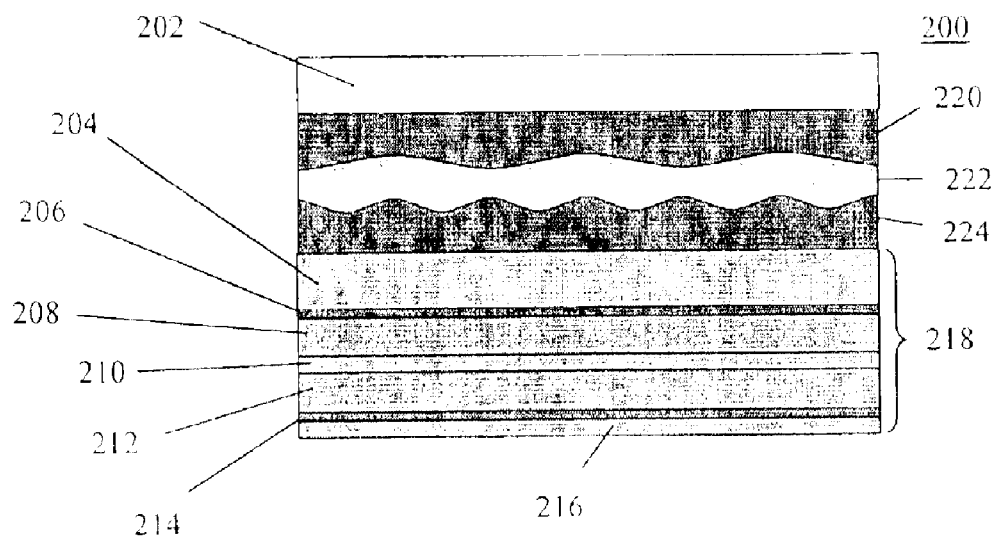
FIG. 2 illustrates an exemplary embodiment including corrugated structures for both feedback and coupling on the same side of the emissive layer.

FIG. 2 illustrates an exemplary embodiment including corrugated structures for both feedback and coupling on the same side of the emissive layer. In FIG. 2, the device 200 includes a transparent substrate 202, an anode 204, a hole injection layer 206, a hole transport layer 208, an emissive layer 210, an electron transport layer 212, an electron injection layer 214, a reflective cathode 216, and a combined feedback and coupling structure. The anode 204, hole injection layer 206, hole transport layer 208, emissive layer 210, electron transport layer 212, electron injection layer 214, and reflective cathode 216 form an organic light emitted diode (OLED) 218. The anode 204 may be made from indium-tin oxide or another suitable transparent, conductive material and the cathode 216 may be made from a reflective, low work function metal such as aluminum, magnesium/silver alloy, calcium, or another suitable material. The combined feedback and coupling structure includes a first dielectric layer 220, a second dielectric layer 222 and a third dielectric layer 224. A corrugated interface between second and third dielectric layers 222, 224 constitutes a feedback structure and the corrugated interface between first and second dielectric layers 220, 222 constitutes a coupling structure. Light is scattered upward and downward from the coupling structure. The downward scattered light is reflected from the cathode 216 and along with the upward scattered light exits from the top of the device 200. This is advantageous because the device is feedback enhanced and may act as a laser with a lasing action in the plane of the device. Thus, there is the potential for strong interaction of the feedback light and excitons in the emitter layer along the whole length of the device as opposed to through the depth of the very thin emitter layer in a strictly vertically emitting device. However, because of the presence of the coupling structure light is coupled out along a direction vertical or near vertical to the plane of the device. Thus, the device is vertically emitting while maintaining the lasing efficiency of edge emitting lasers.

Figure 3:
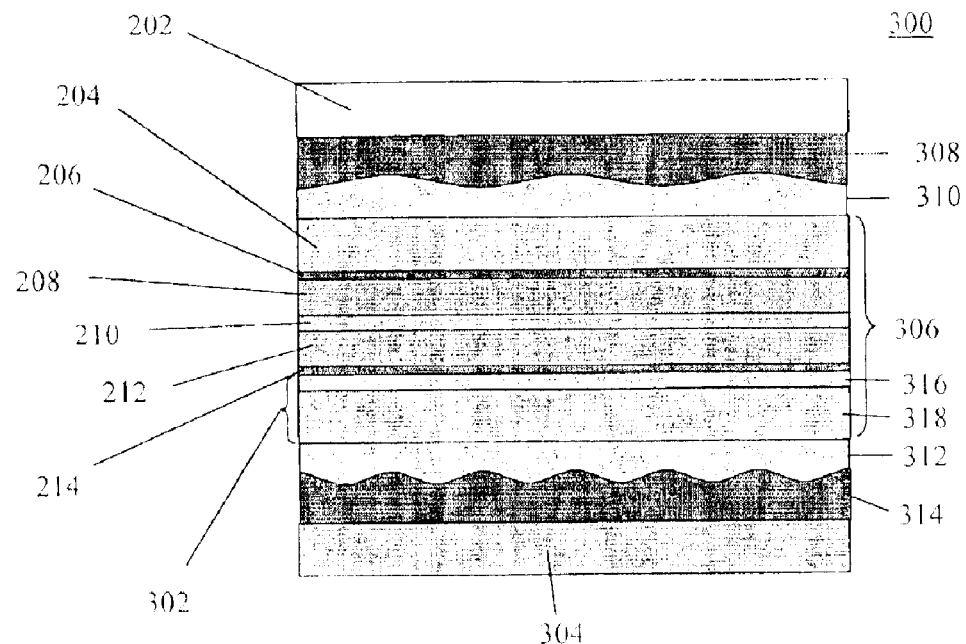
FIG. 3 illustrates another exemplary embodiment having the feedback and coupling structures on opposite sides of the OLED.

FIG. 3 illustrates another exemplary embodiment having the feedback and coupling structures on opposite sides of the OLED. In FIG. 3, the device 300 includes a transparent substrate 202, an anode 204, a hole injection layer 206, a hole transport layer 208, an emissive layer 210, an electron transport layer 212, an electron injection layer 214, a transmissive metal cathode 302, a reflector 304, a coupling structure and a feedback structure. The anode 204, hole injection layer 206, hole transport layer 208, emissive layer 210, electron transport layer 212, electron injection layer 214, and transmissive metal cathode 302 form an OLED 306. The anode 204 may be made from indium-tin oxide or another suitable material. The transmissive metal cathode 302 may be made from a very thin layer of low work function metal 316 backed by a layer of indium-tin oxide 318, or other suitable materials that are transmissive to light emitted from the OLED 306. The coupling structure includes a first dielectric layer 308 and a second dielectric layer 310. The feedback structure includes a third dielectric layer 312 and a fourth dielectric layer 314. A corrugated interface between third and fourth dielectric layers 312, 314 constitutes a feedback structure and the corrugated interface between first and second dielectric layers 308, 310 constitutes a coupling structure. Light is scattered upward and downward from the coupling structure. The light scattered downward from the coupling structure is reflected from the reflector 304 and along with the upward scattered light exits from the top of the device 300. The reflector 304 may be a metal mirror, a multi-layer dielectric reflector, a holographic reflector, or any other suitable light reflecting structure. This is advantageous because ideal cathode materials may not be the most efficient reflectors. Furthermore, by separating the cathode and reflector functions, it may thus be possible to fabricate a more efficient device. Device 300 of FIG. 3 may be advantageous because the refractive index contrasts of the feedback and coupling structures and their distances from the emitter may be tuned separately. This may allow more flexibility in the partitioning of light between feedback and emission. Also, this device may allow the feedback and coupling layers to be in closer proximity to the emitter layer 210 simultaneously. Alternatively, the feedback structure and the coupling structure may be exchanged with each other such that feedback structure on the anode side of the emissive layer 210 and the coupling structure on the cathode side. This may be advantageous because of the ability to allow stronger interaction between light propagating in the plane of the device and the feedback layer. Such a reversed structure produces a vertical emitting laser effect substantially similar to that of device 300 of FIG. 3.

FIGS. 1, 2 and 3 illustrate the corrugations as sinusoidal or substantially sinusoidal. However, other periodic structures in which the refractive index oscillates with the desired periods may be used. For example, square wave and sawtooth corrugation profiles may be used. Although the refractive index boundaries in the feedback and coupling structures are illustrated as being discontinuous, these structures may have refractive indexes that change continuously across the corrugation boundary or may be a combination of discontinuous and continuous. The profile of the refractive index variation in the corrugated feedback and coupling structures determines the bandwidth of the light scattering and therefore impacts the modal structure of the device.

Figure 4:
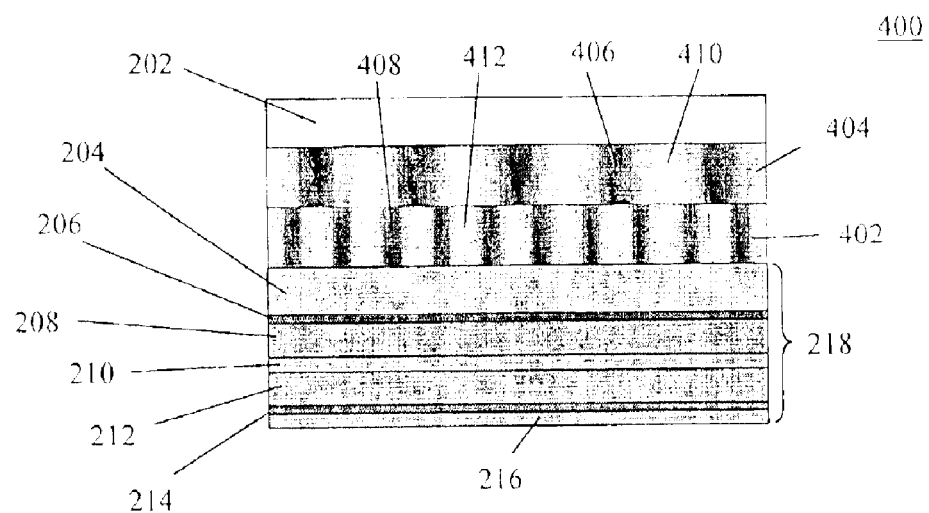
FIG. 4 illustrates another embodiment in which the feedback and coupling structures have a continuous variation of refractive index along an axis in the device plane.

FIG. 4 illustrates another embodiment having a continuous variation of refractive index along an axis in the device plane. The device 400 of FIG. 4 is similar to that of FIG. 2 except that a feedback layer 402 and coupling layer 404 having a continuous variation in refractive index laterally across the layers is substituted for the combined feedback and coupling structure of FIG. 2. In feedback layer 402 and coupling layer 404, dark shaded areas 406 and 408 have higher refractive index than light shaded areas 410 and 412. This is advantageous because the continuously varying structure may have less unwanted scattering into off angles and therefore may maintain more feedback light in the plane of the device.

Another embodiment is a device similar to that of FIG. 3 but fabricated with a coupling layer and a feedback layer having a continuous variation of refractive index along an axis in the device plane. The advantages of this configuration are similar to those of device 300 in FIG. 3. The feedback layer and the coupling layer may be exchanged with each other.

Figure 5:
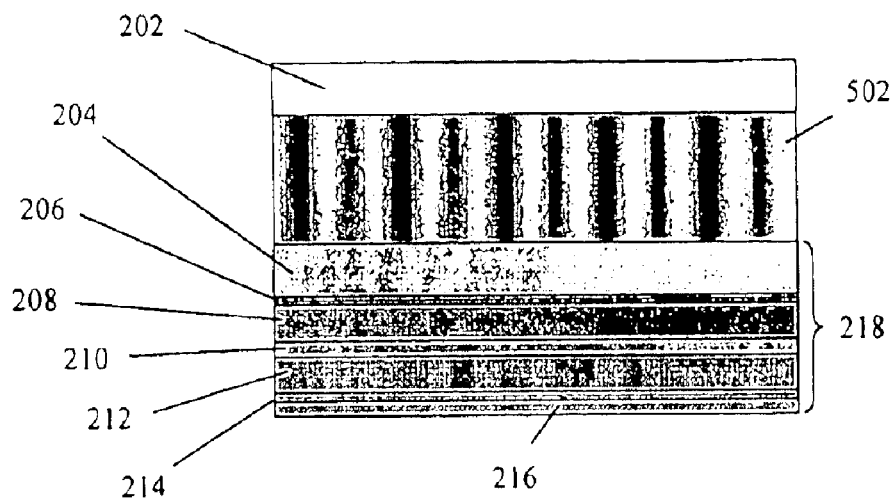
FIG. 5 illustrates another embodiment superimposing the coupling and feedback functions in a single layer having a continuous variation of refractive index along an axis in the device plane.

FIG. 5 illustrates another embodiment superimposing the coupling and feedback functions in a single layer having a continuous variation of refractive index along an axis in the device plane. The device 500 of FIG. 5 is similar to that of FIG. 4 except that the feedback and coupling layers 402, 404 have been replaced by a combined coupling and feedback layer 502 that superimposes the coupling and feedback functions in a single layer. The combination coupling and feedback layer 502 may be formed by superimposing the two index variation profiles. For example, the index of refraction may have the following profile:

$$n_x = n_1 + [a/2(\sin 2\pi\kappa x + 1) + b/2(\sin 4\pi\kappa x + 1)]\Delta n,$$

where $n_x$ is the refractive index as a function of distance along axis x, $\kappa$ is the wavenumber of the scattered light, a is the weight of the coupling profile, b is the weight of the feedback profile, $n_1$ is the low value of the refractive index, and $\Delta n$ is the refractive index contrast.

A non-superimposed profile has a coupling structure separate from the feedback structure such as illustrated in FIG. 4. However, with a superimposed profile such as illustrated in FIG. 5, both structures are the same distance away from the emitter. Thus neither structure interacts more weakly than the other structure, thereby insuring both structures interact sufficiently with light propagating in the plane of the device. Also, the fabrication of this device may be simpler than for devices where the coupling and feedback functions are separated.

Figure 6:
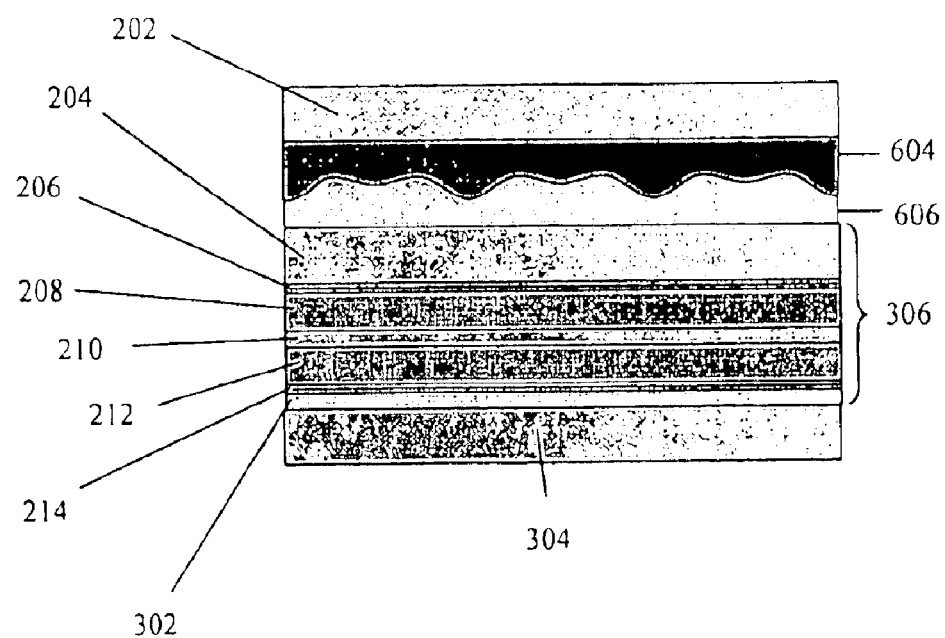
FIG. 6 illustrates another embodiment superimposing the coupling and feedback functions in a single layer with a superimposed corrugation profile.

FIG. 6 illustrates another embodiment superimposing the coupling and feedback functions in a single layer with a superimposed corrugation profile. The device 600 of FIG. 6 is similar to that of FIG. 2 except that the feedback and coupling layers have been replaced by a combined coupling and feedback layer that superimposes the coupling and feedback functions in a single layer. The combined coupling and feedback layer may be formed by superimposing the two corrugations. As an example, the surface profile of the undulations could be described by the equation:

$$n_x = y_1 + [a/2(\sin 2\pi\kappa x + 1) + b/2(\sin 4\pi\kappa x + 1)]\Delta y,$$

where $n_x$ is the refractive index as a function of distance along axis x, $\kappa$ is the wavenumber of the scattered light, a is the weight of the coupling profile, b is the weight of the feedback profile, $y_1$ is the y coordinate at the base of the relief, and $\Delta y$ is the height of the relief.

The combined feedback and coupling layer may be formed from a planarizing layer 604 and a dielectric layer 606. The dielectric layer 606 and the planarizing layer 604 may be fabricated by exposure of a properly selected photoresist film with two light interference patterns in succession. The two interference patterns being formed in such a way that their pitches correspond to the desired feedback and coupling grating pitches respectively. Subsequent etching and coating with the planarizing layer 604 yields the desired structure. This is advantageous because of the ease of fabrication using this method. The photoresist material may be one where the etch depth is a function of exposure dose, for example Shipley S1818 photoresist or any other suitable photo-patternable material.

Figure 7:
FIG. 7 illustrates an embodiment with a combined feedback and coupling layer that has a continuous periodic refractive index variation and is corrugated.

Alternatively, corrugated and continuous variation structures may be combined in a single device. For example, a corrugated structure may be used for a feedback function on a cathode side of a device while a layer with continuously varying refractive index may be used for a coupling function on an anode side of the device. The feedback and coupling functions may be combined in a single structure using a continuous periodic refractive index variation in one of the corrugation layers. This is illustrated in FIG. 7 where a coupling layer 702 with continuous periodic refractive index variation is formed over a corrugated layer 704. (The coupling layer 702 also could be referred to as a combined coupling and feedback layer with the corrugated layer being referred to as a planarizing layer.) The corrugated interface between the two layers serves as a feedback structure. Alternatively, the corrugated feedback structure may be on one side of the device, for example the anode side while the continuously varying refractive index coupling structure is on the other (cathode side). The two structures may be swapped to opposite sides of the device and the corrugated interface may constitute the coupling structure while the continuously varying refractive index layer constitutes the feedback structure.

In the embodiments discussed above, the feedback and coupling structures are outside of the OLED. However, the feedback structure, the coupling structure or both structures may be incorporated into the OLED. The desired refractive index modulation may be imposed in the electrode, carrier transport, and/or emissive layers or other suitable layers of the OLED. Placing the coupling and feedback structures as close as possible to or actually in the emitting layers affords stronger interaction of light propagating in the device plane with these structures.

The refractive index modulation of the layers or structures in OLED often coincides with a modulation in electrical properties such as carrier mobilities or band energies. Thus these embodiments may have considerable variation in device performance across the plane of the device. This may be advantageous in some applications and may not have any appreciable affect on other applications. For example, in lighting applications the possible variation in spectral content of the light output from these small regions may be useful in producing broader band illumination or in producing illumination having another desired spectrum.

Figure 8:
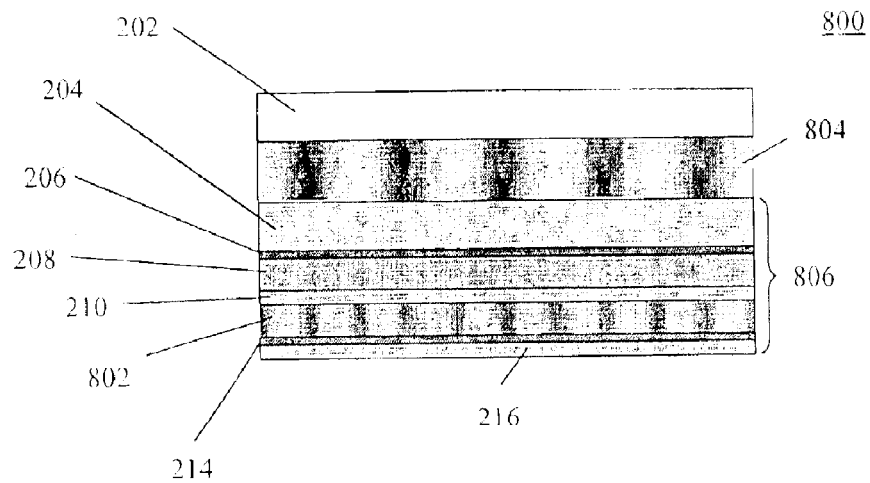
FIG. 8 illustrates an embodiment incorporating a feedback structure into an OLED.

FIG. 8 illustrates an embodiment incorporating a feedback structure into an OLED. The device 800 of FIG. 8 includes a transparent substrate 202, an anode 204, a hole injection layer 206, a hole transport layer 208, an emissive layer 210, an electron injection layer 214, a reflective cathode 216, a combined electron transport layer and feedback structure 802 and a coupling layer 804. An OLED 806 is formed from all of these elements except for the transparent substrate 202 and the coupling layer 804. The refractive index of the combined electron transport layer and feedback structure 802 oscillates in value along an axis in the plane of the device 800 and causes feedback.

The combined electron transport layer and feedback structure 802 may be fabricated by derivatizing an existing electron transport material with crosslinking functional groups such as methacrylate or acrylate groups and doping the material with a photoinitiator. Then, when the material is subjected to a patterned UV exposure with a periodic variation in intensity corresponding to the desired feedback structure, the desired index modulation is formed in the photosensitive electron transport material.

Modulation of refractive index in other layers such as the emitter layer and the hole transport layer can be achieved by similar means using photosensitive, crosslinkable materials to fabricate those layers.

Figure 9:
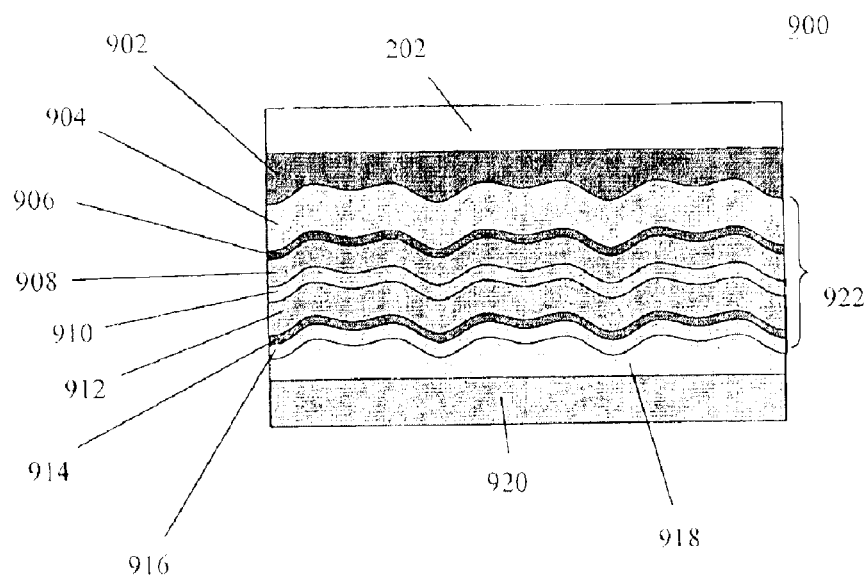
FIG. 9 illustrates another embodiment where an index modulation occurs in the OLED and a planarizing layer is adjacent a reflector.

FIG. 9 illustrates another embodiment where an index modulation occurs in the OLED and a planarizing layer is adjacent a reflector. The device 900 of FIG. 9 includes a transparent substrate 202, a combined feedback and coupling grating structure 902, an anode 904 such as an indium-tin oxide anode, a hole injection layer 906, a hole transport layer 908, an emissive layer 910, an electron transport layer 912, an electron injection layer 914, a transmissive metal cathode 916, a planarizing layer 918 and a reflector 920. The anode 904, hole injection layer 906, hole transport layer 908, emissive layer 910, electron transport layer 912, electron injection layer 914, and transmissive metal cathode 916 form an OLED 922. This embodiment is advantageous because it may be manufactured easily and because the pattern of refractive index variation extends completely through the OLED 922 which produces excellent coupling of the emitted light by the combined feedback and coupling grating structure 902.

The deposition of the layers of the OLED 922 on the undulating surface of the combined feedback and coupling grating structure 902 may induce variation in the thickness of the layers of the OLED 922. However, the strong interaction of light with the periodic structures of the device 900 reduces the amplitude of the relief structure that yields adequate feedback or outcoupling down to about 200 to about 300 nm. When vapor deposition processes are used to build up the OLED 922, the deposition will be sufficiently isotropic to yield layers of substantially uniform thickness.

Alternatively, two or more feedback/coupling layer combinations may be combined in the same device. Two feedback structures may be incorporated into the device along two perpendicular axes in the device plane and then two coupling structures may be incorporated into the device to couple light propagating along these two axes out in the vertical direction. These four structures may be fabricated independently or may be combined in one or more composite structures. Multiple feedback layers or multiple coupling layers may also be incorporated into a device along the same axis to increase the interaction with emitted light thereby increasing the intensity of feedback light. If a single feedback or coupling structure fails to give a sufficiently high flux of scattered light a second feedback or coupling structure may be added.

Figure 10:
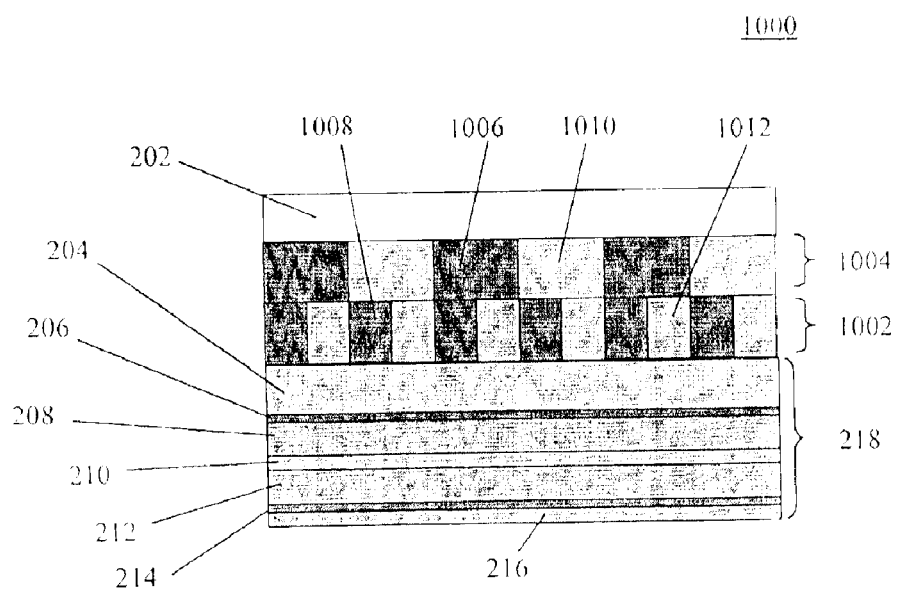
FIG. 10 illustrates another embodiment with a discontinuous periodic index variation.

FIG. 10 illustrates another embodiment with a discontinuous periodic index variation. Device 1000 is similar to device 400 of FIG. 4 except that the variation in refractive index through feedback layer 1002 and coupling layer 1004 is discontinuous rather than continuous as in feedback layer 402 and coupling layer 404. The dark shaded areas 1006 and 1008 correspond to areas of higher refractive index while the light shaded areas 1010 and 1012 correspond to areas of lower refractive index.

The feedback and coupling structures illustrated in FIG. 10 may be fabricated by exposing films of photosensitive material with light spatially modulated at the desired frequency v. The exposure, which may be coupled with subsequent processing, creates the desired continuous variation of refractive index in the film. The desired spatial modulation in the light may be created by the interference of two beams of light to form an interference pattern in the film of photosensitive material. Alternatively, three or more light beams may be used to create the interference pattern. Holographic recording materials and some photoresists may be used as the photosensitive material.

The portion of light entrained in the plane of the device by the feedback structure or structures and the portion of the light extracted from the device by the coupling layer are selected to provide a proper balance between the light fed back into the device and the light coupled out of the device. If too much light is coupled out of the device and too little light remains entrained in the plane of the device, there will be insufficient light to support stimulated emission and device radiance will be undesirably low. Conversely, if too little light is coupled out of the device and too much light remains entrained in the plane of the device, the light will pass through absorbing materials and scattering structures in its path so many times that the absorption and other losses will be so great that the overall device radiance will be reduced.

The proper balancing of entrained and coupled light may be selected by adjusting the level of light interaction with the feedback and coupling structures respectively. The level of interaction with these structures may be controlled by adjusting the magnitude of the refractive index variation in the layer ($\Delta n$), the distance of the feedback or coupling layer from the emissive layer, and the thickness of the region of index modulation. The thickness of the region of index modulation corresponds to the depth of the corrugations in corrugated structures. The device design may be tuned using these three parameters to maximize the efficiency of light emission from the device or to otherwise select a desired design.

The efficiency of the device may be increased by making sure that a larger or maximum amount of light emanating from the emissive layer is captured in the plane of the device and not scattered over a wide range of angles. An exemplary way to accomplish this to by incorporating a light pipe or waveguide into the device. For example, a waveguide may be formed by a layer of high index material in the plane of the device bounded on either side by lower index materials. Reflection from the index boundaries on either side of the high index layer helps constrain light to remain in the layer. Such high index of refraction layer has a thickness of around one wavelength or greater such that the light is constrained to remain in the layer. Since the emissive layer will often be smaller than one wavelength in thickness (e.g., the emissive layer is often 50 nanometers or less in thickness), the emissive layer is usually too thin to serve as the high index core of a waveguide. Thus, the high index core must be thickened with additional material beyond the emissive layer in order to constrain light in the plane of the device.

The emissive devices discussed above may also be provided with a waveguide internal to the emissive device. The waveguide may be in close proximity to and/or included in the emitter layer. Such a device may include a grating, an anode adjacent the grating, a hole injection layer adjacent the anode, a hole transport layer adjacent the hole injection layer, an emissive layer adjacent the hole injection layer, an electron transport layer adjacent emissive layer, an electron injection layer adjacent the electron transport layer, a cathode adjacent the electron injection layer and a planarizing layer adjacent the cathode. The hole transport layer and the anode may have an index of refraction higher than the electron transport layer and the grating such that the hole transport layer and the anode form the high refractive index core of a waveguide. The emitter layer may have any refractive index, but it is advantageous to have the emitter layer refractive index equal to or higher than the refractive index of the hole transport layer. The grating and the electron transport layer form a low index cladding for the waveguide. The waveguide so formed captures a large portion of the light emitted in the device constraining the light to propagate more or less in the plane of the device. The corrugations in the grating comprise the superimposed relief profiles of both a coupling structure and a feedback structure. These corrugations extend upward from the grating through the multiple layers in the device. The corrugated structure so formed feeds back light propagating in the plane of the device causing further stimulated emission in the emitter layer. The corrugated structure also couples some fraction of the light propagating in the plane of the device out of the device at an angle normal to or near normal to the plane of the device or couples some fraction of light propagating in the plane of the device out of the device at predetermined angles. Emissive devices including waveguide are further discussed below with respect to FIG. 11 and FIG. 12.

One of the highest indexes of refraction in a device may be the indium-tin oxide in the anode and/or the cathode. This indium-tin oxide may be used as part of a waveguide. Unfortunately, indium-tin oxide is only sufficiently transparent in very thin sections and light traversing the indium-tin oxide in the plane of the device may be strongly absorbed. Thus, it is desirable to have a waveguide structure that constrains the emitted light to remain in a volume containing the emissive layer or immediately adjacent to it while simultaneously minimizing interaction with the indium-tin oxide.

Figure 11:
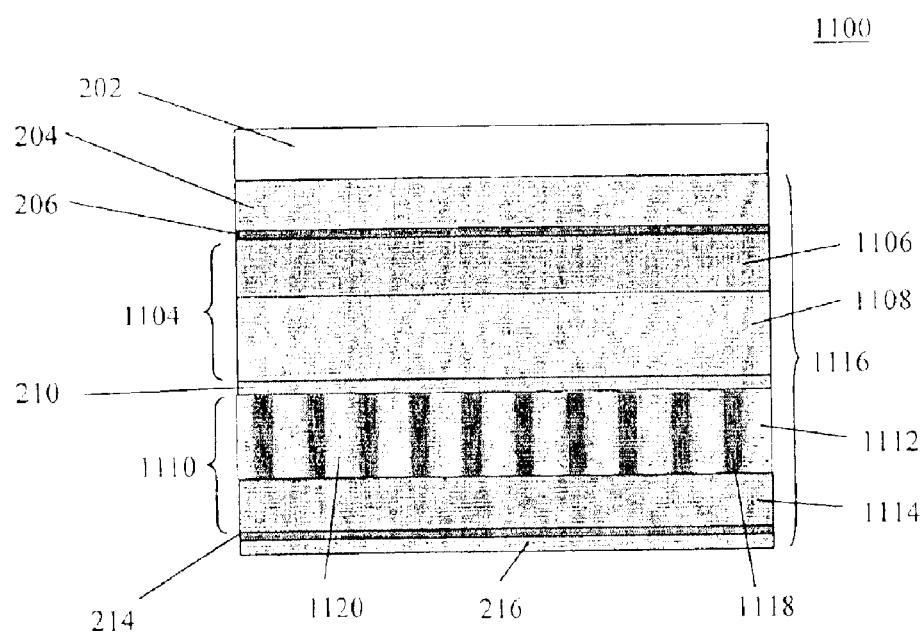
FIG. 11 illustrates an exemplary embodiment of a device that provides waveguiding with a minimal amount of absorption.

FIG. 11 illustrates an exemplary embodiment of a device 1100 that provides waveguiding with a minimal amount of absorption. The device 1100 includes a transparent substrate 202, an anode 204, a hole injection layer 206, an emissive layer 210, an electron injection layer 214, a reflective cathode 216, a hole transport medium 1104 formed from a first hole-transport layer 1106 and a second hole transport layer 1108, an electron transport medium 1110 formed from a first electron transport layer 1112 and a second electron transport layer 1114. The first electron transport layer 1112 also contains the feedback and coupling structures formed by a continuous variation of refractive index through the layer in the plane of the device. In FIG. 11 the dark shaded areas 1118 in layer 1112 have a higher refractive index while the light shaded areas 1120 have a lower refractive index. The index variation may only be along an axis in the plane of the figure or it may be along both that axis and a second axis orthogonal to the plane of the figure as was described with respect to FIG. 9. The variation of refractive index may be produced in a manner similar to that described with respect to layer 802 in device 800. However, in this example the feedback and coupling grating profiles are superimposed in the same layer as was described for layer 502 in device 500. The anode 204, hole transport layer 208, emissive layer 210, electron injection layer 214, reflective cathode 216, the hole transport medium 1104 and electron transport medium 1110 form an OLED 1116.

The material in the second hole transport layer 1108 may be chosen to have a considerably higher index of refraction than that in first hole transport layer 1106. The material in the first electron transport layer 1112 may be chosen to have indices of refraction varying from $n_1$ from points 1120 up to higher index $n_2$ at points 1118. Both indices $n_1$ and $n_2$ may be chosen to be higher than refractive index $n_c$ in second electron transport layer 1114. The second hole transport layer 1108, the first electron transport layer 1112 and the emissive layer 210 form the high index core of a waveguide. The first hole transport layer 1106 and the second electron transport layer 1114 serve as the low index waveguide cladding of the waveguide. The indices of refraction of the emissive layer 210, the second hole transport layer 1108 and one of the indices of refraction of the first electron transport layer 1112 may be selected to be similar or the same to each other to avoid unwanted reflections, scattering and the like. However, when the thickness of the emissive layer 210 is extremely small, which typically occurs, the emissive layer 210 may have any index of refraction without any substantial deleterious optical effect.

The feedback and coupling structures need not be in the high refractive index core of the waveguide so long as they are in sufficiently close proximity such that the feedback and coupling structures of a device interact with in-plane propagating light to adequately scatter light in the in-plane and output directions.

Figure 12:
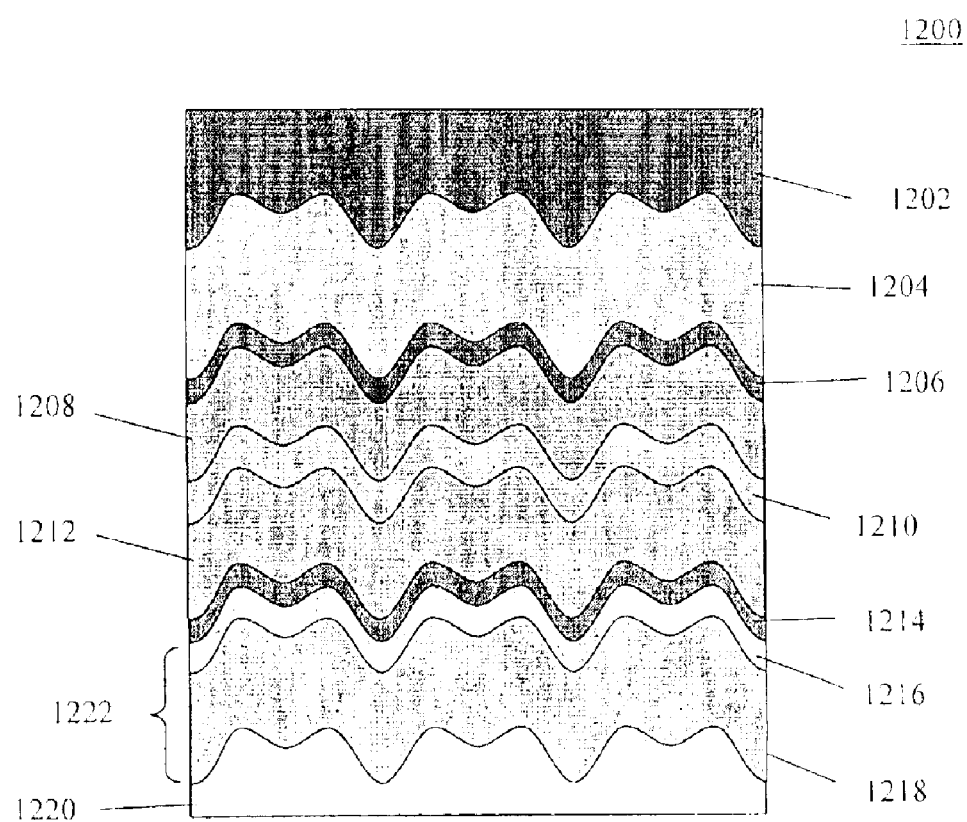
FIG. 12 illustrates another embodiment with waveguiding.

FIG. 12 illustrates another embodiment with waveguiding. In FIG. 12, a device 1200 uses the refractive index variations between currently available waveguide materials to create a rough waveguide inside the OLED structure. The device 1200 include a grating 1202 that combines the functions of feedback and coupling structures having an index of refraction of about 1.5 made from a material such as Shipley S11818 photoresist or any other suitable photo-patternable material, an indium-tin oxide anode 1204 having an index of refraction of about 1.9, a copper phthalocyanine hole injection layer 1206, an α-NPB hole transport layer 1208 having an index of refraction of about 1.9, an $Alq_3$+ dopant (e.g., coumarin 153) emissive layer 1210 having an index of refraction of about 1.72, $Alq_3$ electron transport layer 1212 having an index of refraction of about 1.72, an LiF electron injection layer 1214, an aluminum cathode 1216, an indium-tin oxide conductive cathode backing 1218 having an index of refraction of about 1.9, and a planarizing layer 1220 having an index of refraction of about 1.5. The aluminum cathode 1216 and the indium-tin oxide conductive cathode backing 1218 form a transparent cathode structure 1222. The aluminum cathode 1216 provides the source of electrons for the emissive 1210 while the indium-tin oxide conductive cathode backing 1218 conducts current to the aluminum cathode 1216 since the aluminum cathode 1216 is sufficiently thin that it is transparent. The indium-tin oxide anode 1204 and α-NPB hole transport layer 1208 in this device constitute a core of material with refractive index equal to about 1.9. These layers are surrounded by lower index layers constituting photoresist material and the emissive layer plus electron transport layer. The copper phthalocyanine hole injection layer 1206, LiF electron injection layer 1214, and aluminum cathode 1216 are too thin to interact optically.

Alternatively, a coupling layer with refractive index modulation of pitch $v=\kappa$ may be used to couple light vertically out of an OLED-based laser in which feedback and therefore light emission occur in the plane of the device. As such, other distributed feedback structures may be used in addition to those described herein as has been described above. The same vertical coupling technique also works with edge-emitting OLED lasers in which the feedback occurs from ordinary reflections from cleaved surfaces, metallized surfaces or other reflectors at the ends of the laser cavity. Other OLED structures may be substituted for the OLED structures illustrated in the figures. Non-OLED structures may be substituted for the OLED structures illustrated in the figures. The OLED structures may include additional layers such as a hole blocker layer of bathocuproine (2,9-dimethyl-4,7-diphenyl-1,10-phenanthroline) or another suitable material. Blocker layers are discussed in U.S. Pat. Nos. 6,451,415 and 6,097,147.

The gratings herein may be made by different methods and of different materials. For example, the gratings may be fabricated written using electron beam, by multiple (e.g., two) beam interference methods or by or other suitable method. Such gratings may be mass produced by first writing a grating on photoresist or other suitable material and then replicating the grating by an embossing method or another suitable method. The production of multiple copies at a time may be achieved by using a polymer substrate as a master relief structure such as used in used to replicate compact disks and security holograms as used on credit cards and banknotes. The relief structure on the master relief structure is transferred, for example, by electroplating or vacuum deposition, onto a metal shim that may used as a stamp for pressing replicas, or as an injection mould. Alternatively, contact copying onto a further photoresist layer on glass and etching through the photoresist into the glass may be used to fabricate the relief structure in glass. In addition to photoresist and glass, the gratings may be made from polymeric materials such as polycarbonate, polyurethane, or any other suitable material.

With the two beam interference method, collimated beams from a laser of wavelength $\lambda$ interfere at an angle $\theta$ such that $\lambda = 2 p \sin(\theta/2)$ where p is the desired pitch of the grating. The exposure and development of the photoresist may be varied to control the depth of the relief structure. If two or more gratings of differing pitch are required, the gratings may be superimposed by making two separate exposures on the same photoresist.

EXAMPLE

A glass substrate is spin coated with a 1 micron thick layer of Shipley S1818 photoresist. The photoresist is exposed simultaneously to two interfering beams of UV radiation, 351 nm wavelength, from an argon ion laser. The propagation directions of the two beams are each parallel to the same plane normal to the surface of the hologram plate. One beam strikes the surface at a 50.1° angle relative to the normal while the second strikes the surface at −50.1° to the normal (100.2 degree angle between the two beams). The total radiation dose delivered is on the order of 100 mJ/square cm. The exact dose may be established by calibration runs. A second exposure of the same plate is made with the argon ion laser set to yield the 488 nm line and with the two beams striking the surface at 32.2° and −32.2° in the same plane as the previous two exposures. Once again the total radiation dose delivered is approximately 100 $mJ/cm^2$. The first exposure is set to yield a grating written at a spatial period of 229 nm. The second exposure is set to yield a superimposed second grating written at a spatial period of 457.9 nm. The exposed plates then are immersed in undiluted Shipley 303A developer for two minutes, rinsed under running de-ionized water for 2.5 minutes and dried using dry nitrogen gas. The photoresist forms a relief of approximately 30 nm in depth.

An OLED device stack may now be built up on the relief surface of the holographic plate with the following successively vacuum deposited layers including a 150 nm indium-tin oxide cathode backing, a 7 nm aluminum cathode, 10 nm lithium fluoride electron injection layer, 35 nm aluminum triquinoline electron transport layer, 10 nm bathocuproine (2,9-dimethyl-4,7-diphenyl-1,10-phenanthroline) hole blocker, 50 nm H9680 emitter (H9680 emitter is available from Specialty Chemicals in Morristown, N.J.), a 75 nm N,N'-di(3-methylphenyl)-N,N'-diphenylbenzidine hole transport layer, a 10 nm copper phthalocyanine hole injection layer and a 150 nm indium-tin oxide anode.

Although several embodiments of the present invention and its advantages have been described in detail, it should be understood that changes, substitutions, transformations, modifications, variations, permutations and alterations may be made therein without departing from the teachings of the present invention, the spirit and the scope of the invention being set forth by the appended claims.

I claim:

1. A light emitting diode device comprising:
   a light emitting diode; and
   a vertical coupling structure,
   wherein the vertical coupling structure changes a propagation direction of a portion of a substantially horizontal stimulated light emission within the light emitting diode such that the portion of the substantially horizontal stimulated light emission exits the light emitting diode as output light, and
   wherein the light emitting diode includes a high index of refraction area sandwich between low index refraction areas.

2. The device of claim 1, wherein the output light propagates substantially normal to a plane substantially parallel to the light emitting diode.

3. The device of claim 1, wherein the output light propagates at ±θ° to a normal to a plane substantially parallel to the light emitting diode.

4. The device of claim 1, wherein the vertical coupling structure is corrugated.

5. The device of claim 1, wherein the vertical coupling structure has an oscillating refractive index along a plane substantially parallel to the light emitting diode.

6. The device of claim 1, wherein the vertical coupling structure has a continuous variation in refractive index.

7. The device of claim 1, wherein the vertical coupling structure has a discontinuous variation in refractive index.

8. The device of claim 1, wherein the vertical coupling structure is periodic.

9. The device of claim 1, wherein the vertical coupling structure includes a first dielectric material and a second dielectric material.

10. The device of claim 1, further comprising a light feedback structure.

11. The device of claim 10, wherein the light feedback structure is corrugated.

12. A light emitting diode device comprising:
    a light emitting diode;
    a vertical coupling structure; and
    a light feedback structure,
    wherein the vertical coupling structure changes a propagation direction of a portion of a substantially horizontal stimulated light emission within the light emitting diode such that the portion of the substantially horizontal stimulated light emission exits the light emitting diode as output light, and
    wherein the light feedback structure has an oscillating refractive index along a plane substantially parallel to the light emitting diode.

13. A light emitting diode device comprising:
    a light emitting diode;
    a vertical coupling structure; and
    a light feedback structure,
    wherein the vertical coupling structure changes a propagation direction of a portion of a substantially horizontal stimulated light emission within the light emitting diode such that the portion of the substantially horizontal stimulated light emission exits the light emitting diode as output light, and
    wherein the light feedback structure has a continuous variation in refractive index.

14. A light emitting diode device comprising:
    a light emitting diode;
    a vertical coupling structure; and
    a light feedback structure,
    wherein the vertical coupling structure changes a propagation direction of a portion of a substantially horizontal stimulated light emission within the light emitting diode such that the portion of the substantially horizontal stimulated light emission exits the light emitting diode as output light, and
    wherein the light feedback structure has a discontinuous variation in refractive index.

15. The device of claim 10, wherein the light feedback structure is periodic.

16. The device of claim 1, wherein the vertical coupling structure includes part of a light feedback structure.

17. The device of claim 1, wherein the vertical coupling structure includes a light feedback structure.

18. The device of claim 1, wherein the high index of refraction area includes a light emitting material.

19. The device of claim 1, wherein the light emitting diode includes a light emitting material, the light emitting material being one of:
    an organic semiconductor material;
    a combination of organic and inorganic semiconductor materials; or
    an organometallic semiconductor material; or
    an inorganic semiconductor material.

20. A light emitting diode device comprising;
    a light emitting diode; and
    a vertical coupling structure,
    wherein the vertical coupling structure changes a propagation direction of a portion of a substantially horizontal stimulated light emission within the light emitting diode such that the portion of the substantially horizontal stimulated light emission exits the light emitting diode as output light, and
    wherein the vertical coupling structure has an oscillating refractive index along a plane substantially parallel to the light emitting diode.

21. The device of claim 20, wherein the output light propagates substantially normal to a plane substantially parallel to the light emitting diode.

22. The device of claim 20, wherein the output light propagates at ±θ° to a normal to a plane substantially parallel to the light emitting diode.

23. The device of claim 20, wherein the vertical coupling structure is corrugated.

24. The device of claim 20, wherein the vertical coupling structure is periodic.

25. The device of claim 20, wherein the vertical coupling structure includes a first dielectric material and a second dielectric material.

26. The device of claim 20, further comprising a light feedback structure.

27. The device of claim 26, wherein the light feedback structure is corrugated.

28. The device of claim 26, wherein the light feedback structure is periodic.

29. The device of claim 20, wherein the vertical coupling structure includes part of a light feedback structure.

30. The device of claim 20, wherein the vertical coupling structure includes a light feedback structure.

31. The device of claim 20, wherein the light emitting diode includes a light emitting material, the light emitting material being one of:
   an organic semiconductor material;
   a combination of organic and inorganic semiconductor materials; or
   an organometallic semiconductor material; or
   an inorganic semiconductor material.

32. A light emitting diode device comprising:
   a light emitting diode; and
   a vertical coupling structure,
   wherein the vertical coupling structure changes a propagation direction of a portion of a substantially horizontal stimulated light emission within the light emitting diode such that the portion of the substantially horizontal stimulated light emission exits the light emitting diode as output light, and
   wherein the vertical coupling structure has a continuous variation in refractive index.

33. The device of claim 32, wherein the output light propagates substantially normal to a plane substantially parallel to the light emitting diode.

34. The device of claim 32, wherein the output light propagates at $\pm\theta°$ to a normal to a plane substantially parallel to the light emitting diode.

35. The device of claim 32, wherein the vertical coupling structure is corrugated.

36. The device of claim 32, wherein the vertical coupling structure is periodic.

37. The device of claim 32, wherein the vertical coupling structure includes a first dielectric material and a second dielectric material.

38. The device of claim 32, further comprising a light feedback structure.

39. The device of claim 38, wherein the light feedback structure is corrugated.

40. The device of claim 39, wherein the light feedback structure is periodic.

41. The device of claim 32, wherein the vertical coupling structure includes part of a light feedback structure.

42. The device of claim 32, wherein the vertical coupling structure includes a light feedback structure.

43. The device of claim 32, wherein the light emitting diode includes a light emitting material, the light emitting material being one of:
   an organic semiconductor material;
   a combination of organic and inorganic semiconductor materials; or
   an organometallic semiconductor material; or
   an inorganic semiconductor material.

44. A light emitting diode device comprising:
   a light emitting diode; and
   a vertical coupling structure,
   wherein the vertical coupling structure changes a propagation direction of a portion of a substantially horizontal stimulated light emission within the light emitting diode such that the portion of the substantially horizontal stimulated light emission exits the light emitting diode as output light, and
   wherein the vertical coupling structure has a discontinuous variation in refractive index.

45. The device of claim 44, wherein the output light propagates substantially normal to a plane substantially parallel to the light emitting diode.

46. The device of claim 45, wherein the output light propagates at $\pm\theta°$ to a normal to a plane substantially parallel to the light emitting diode.

47. The device of claim 44, wherein the vertical coupling structure is corrugated.

48. The device of claim 44, wherein the vertical coupling structure is periodic.

49. The device of claim 44, wherein the vertical coupling structure includes a first dielectric material and a second dielectric material.

50. The device of claim 44, further comprising a light feedback structure.

51. The device of claim 50, wherein the light feedback structure is corrugated.

52. The device of claim 50, wherein the light feedback structure is periodic.

53. The device of claim 44, wherein the vertical coupling structure includes part of a light feedback structure.

54. The device of claim 44, wherein the vertical coupling structure includes a light feedback structure.

55. The device of claim 44, wherein the light emitting diode includes a light emitting material, the light emitting material being one of:
   an organic semiconductor material;
   a combination of organic and inorganic semiconductor materials; or
   an organometallic semiconductor material; or
   an inorganic semiconductor material.

* * * * *